United States Patent [19]
Oka

[11] Patent Number: 4,830,947
[45] Date of Patent: May 16, 1989

[54] LIGHT-SENSITIVE MATERIAL CONTAINING SILVER HALIDE, REDUCING AGENT AND POLYMERIZABLE COMPOUND

[75] Inventor: Yutaka Oka, Kanagawa, Japan

[73] Assignee: Fuji Photo Film Co., Ltd., Kanagawa, Japan

[21] Appl. No.: 104,909

[22] Filed: Oct. 6, 1987

[30] Foreign Application Priority Data

Oct. 6, 1986 [JP] Japan ................................ 61-238870

[51] Int. Cl.$^4$ ......................... G03C 1/72; G03C 7/26
[52] U.S. Cl. ..................................... 430/138; 430/270; 430/281; 430/292; 430/539; 430/545; 430/905; 430/909
[58] Field of Search ............... 430/203, 138, 253, 254, 430/270, 281, 292, 539, 545, 905, 909

[56] References Cited

U.S. PATENT DOCUMENTS

| | | | |
|---|---|---|---|
| 4,052,214 | 10/1977 | Oishi et al. | 430/214 |
| 4,483,914 | 11/1984 | Naito et al. | 430/545 |
| 4,624,910 | 11/1986 | Takeda | 430/328 |
| 4,629,676 | 12/1986 | Hayakawa et al. | 430/325 |
| 4,649,098 | 3/1987 | Takeda | 430/406 |
| 4,683,192 | 7/1987 | Nishiyama | 430/605 |
| 4,704,344 | 11/1987 | Aono et al. | 430/215 |

Primary Examiner—Paul R. Michl
Assistant Examiner—Patrick A. Doody
Attorney, Agent, or Firm—Sughrue, Mion, Zinn, Macpeak & Seas

[57] ABSTRACT

A light-sensitive material comprising a light-sensitive layer containing silver halide, a hydrophilic polymer adsorbed on the silver halide, a reducing agent and a polymerizable compound provided on a support, characterized in that the hydrophilic polymer comprises gelatin and a water soluble vinyl polymer having a high physical retardance is disclosed. The ratio of the vinyl polymer to the gelatin ranges from 0.1 to 20 weight %. The physical retardance of the vinyl polymer is not less than 25.0, which is defined as a value measured according to PAGI method.

17 Claims, No Drawings

LIGHT-SENSITIVE MATERIAL CONTAINING SILVER HALIDE, REDUCING AGENT AND POLYMERIZABLE COMPOUND

BACKGROUND OF THE INVENTION

1. Field of the invention

This invention relates to a light-sensitive material comprising a light-sensitive layer containing silver halide, a reducing agent and a polymerizable compound provided on a support.

2. Description of prior art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741 (corresponding to U.S. Pat. No. 3,687,667) and 49(1974)-10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to form a polymer within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441 (the contents of these three publications are described in United States Patent Application Ser. No. 827,702).

The above-mentioned image forming methods are based on the principle in which the polymerizable compound is polymerized within the area where a latent image of the silver halide has been formed.

Further, Japanese Patent Provisional Publication No. 61(1986)-260241 (corresponding to United States Patent Application Ser. No. 854,640 and European Patent Provisional Publication No. 0202490A) describes another image-forming method in which the polymerizable compound within the area where a latent image of the silver halide has not been formed is polymerized. In this method, when the material is heated, the reducing agent functions as a polymerization inhibitor within the area where a latent image of the silver halide has been formed, and the polymerizable compound within the other area is polymerized.

In preparation of the above-mentioned light-sensitive materials, a hydrophilic polymer is preferably used as a protective colloid of silver halide. After the preparation, the hydrophilic polymer is adsorbed on the silver halide in the light-sensitive material. Japanese Patent Provisional Publication Nos. 61(1986)-275742 and 61(1986)-278849 (the contents of both publications are described in United States Patent Application Ser. No. 868,385 and European Patent Provisional Publication No. 0203613A) descibes examples of the hydrophilic polymer including gelatin (which is most preferred), polyvinyl alcohol, polyvinyl pyrrolidone, polyvinyl imidazole etc.

SUMMARY OF THE INVENTION

The present inventor has noted that the occurence of fog is much reduced when a water soluble vinyl polymer having a high physical retardance (e.g., polyvinyl alcohol, polyvinyl pyrrolidone, polyvinyl imidazole) is adsorbed on silver halide in the light-sensitive material. However, it is observed that the sensitivity of the light-sensitive material lowers when the conventional protective colloid for silver halide, namely, gelatin, is replaced with the vinyl polymer having a high physical retardance. As a result of further study, the inventor has discovered that where a portion of the gelatin is replaced with the vinyl polymer, the occurence of fog is reduced without lowering of the sensitivity.

An object of the present invention is to provide a light-sensitive material which is highly sensitive and gives an improved clear image reduced in occurence of fog.

Another object of the invention is to provide a light-sensitive material which gives a clear image regardless of variation of developing conditions, such as the heating time and temperature.

There is provided by the present invention a light-sensitive material comprising a light-sensitive layer containing silver halide, a hydrophilic polymer adsorbed on the silver halide, a reducing agent and a polymerizable compound provided on a support, characterized in that the hydrophilic polymer comprises gelatin and a water soluble vinyl polymer having a high physical retardance in a ratio of the vinyl polymer to the gelatin ranging from 0.1 to 20 weight %. The physical retardance of the vinyl polymer is not less than 25.0, which is defined as a value measured according to PAGI (Photographic and Gelatin Industries, Japan) method.

The present inventor has found that the occurence of fog is reduced where a water soluble vinyl polymer having a high physical retardance is used as a protective colloid in combination with gelatin in an amount of at least 0.1 weight % based on the gelatin. If the vinyl polymer is used in an amount of not more than 20 weight % based on the gelatin, the sensitivity of the light-sensitive material is scarcely reduced. In other words, where the hydrophilic polymer adsorbed on silver halide comprises gelatin and the vinyl polymer in a ratio of the vinyl polymer to the gelatin ranging from 0.1 to 20 weight %, the occurence of fog is prominently reduced without lowering of the sensitivity of the light-sensitive material. Therefore, the light-sensitive material of the present invention is highly sensitive and gives a very clear image reduced in occurence of fog. The vinyl polymer in the invention is much effective where silver halide used in the light-sensitive material has a tendency to be fogged, for example, where silver halide has a relatively large particle size of not less than 0.001 μm.

Further, the water soluble vinyl polymer having a high physical retardance has a function of keeping the sharpness of the obtained image at a constant level regardless of variation of the developing condition, especially heating time and temperature. Therefore, the light-sensitive material of the invention can be advantageously used in an image-forming method employing a heat development process.

DETAILED DESCRIPTION OF THE INVENTION

The water soluble vinyl polymer used in the present invention has a high physical retardance of not less than 25.0, which is defined as a value measured according to PAGI (Photographic and Gelatin Industries, Japan) method. The physical retardance of the vinyl polymer more preferably ranges from 55.0 to 95.0.

In the PAGI method, the physical retardance is defined with respect to 10% aqueous solution of gelatin. However, in the present specification, 10% aqueous solution of a water soluble vinyl polymer is used in place of the gelatin solution and measured in the same manner as in the PAGI method.

The physical retardance defined in the PAGI method is measured according to the following manner.

To 17.6 g of sodium chloride and 100 ml of 1N sulfuric acid is added distilled water to make 1,000 ml (solution A). To 17.0 g of silver nitrate is added distilled water to make 1,000 ml (solution B). In 300 ml of distilled water is dissolved 30 g of a sample vinyl polymer. To 100 ml of this solution is added 20 ml of solution A, and the resulting solution is warmed to 60±0.5° C. Using a glass test tube, 20 ml of solution B (at 60° C.) is added to the vinyl polymer solution in about 2 to 3 seconds while stirring with a glass rod. The resulting silver chroride emulsion is ripened for 20 minutes stirring once per minute in a thermostated bath at 60±0.5° C. At the end of ripening, 5.0 ml of this solution is withdrawn by means of a pipette and injected into 30 ml of distilled water (at 15-20° C.) to make the test solution. A sample cell is filled with the test solution, and then the transmittance is measured using Turbidimeter (e.g., Tokyo Photo-Electric Co., Ltd., Model ANA-14S) without filter. The reading value (transmittance as a percentage) is the physical retardance of the vinyl polymer.

Testing method and apparatus of measurement for the physical retardance are described in more detail in a published Specification PAGI METHOD, 3rd edition (1977) under the titles of Transmittance (1.6) and Physical Retardance (2.6).

The vinyl polymer having the above-defined physical retardance preferably has hydroxyl group or amide bond. Examples of the vinyl polymer having a high physical retardance include polyvinyl alcohol, a polyvinyl alcohol derivative, polyvinyl pyrrolidone, a polyvinyl pyrrolidone derivative, polyvinyl imidazole, a polyvinyl imidazole derivative and a copolymer comprising at least two kinds of the repeating units contained in these polymers. The polymerization degree of these polymers, the ratio of the repeating units of the copolymer and the saponification rate of polyvinyl alcohol are determined in consideration of the physical retardance and the miscibility to gelatin. Among these polymers, polyvinyl alcohol, polyvinyl pyrrolidone and vinyl alcohol/vinyl pyrrolidone copolymer are preferred.

In the light-sensitive material of the invention, the above-mentioned water soluble vinyl polymer is used in conbination with gelatin. In the present invention, examples of the gelatin include a gelatin derivative and a gelatin grafted with other polymers. Examples of employable gelatin include not only lime-processed gelatin, but also acid-processed gelatin and enzyme-processed gelatin. Hydrolysis products or enzymatic decomposition products of gelatin can also be used.

In the present invention, the ratio of the vinyl polymer to the gelatin ranges from 0.1 to 20 weight %. The ratio more preferably ranges from 0.5 to 5 weight %. The vinyl polymer is preferably used in an amount of 0.1 to 25 weight % based on the silver content of the silver halide, and more preferably in an amount of 0.5 to 10 weight %.

In the light-sensitive material, the hydrophilic polymer comprising the gelatin and the water soluble vinyl polymer is adsorbed on silver halide. In order to adsorb the hydrophilic polymer on silver halide, the silver halide is preferably prepared in the form of a silver halide emulsion, and the hydrophilic polymer is preferably used as a protective colloid of silver halide in preparation of the silver halide emulsion. Alternatively, using only gelatin as a protective colloid, the vinyl polymer can be added to the silver halide emulsion simultaneously with or after the preparation. The preparation of the silver halide emulsion will be described later in more detail.

The silver halide, the reducing agent, the polymerizable compound and the support which constitute the light-sensitive material of the invention with the hydrophilic polymer are described below. Thus composed material is referred hereinafter to as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous. The heterogeneous grains having a multilayered structure in which the halogen composition varies from the core to the outer shell (see Japanese Patent Provisional Publication Nos. 57(1982)-154232, 58(1983)-108533, 59(1984)-48755 and 59(1984)-52237, U.S. Pat. No. 4,433,048, and European Pat. No. 100,984) can be employed. A silver halide grain having a core/shell structure in which the silver iodide content in the shell is higher than that in the core can be also employed.

There is no specific limitation on the crystal habit of silver halide grains. For example, a tabular grain having an aspect ratio of not less than 3 can be used.

Two or more kinds of silver halide grains which differ in halogen composition, crystal habit, grain size, and/or other features from each other can be used in combination.

There is no specific limitation on grain size distribution of silver halide grains. For example, the silver halide grains having such a grain size distribution that the coefficient of the variation is not more than 20% can be employed.

The silver halide grains ordinarily have a mean size of 0.001 to 5 μm, more preferably 0.001 to 2 μm. The vinyl polymer in the invention is much effective where silver halide in the light-sensitive material has a tendency to be fogged, for example silver halide grains has a relatively large mean size of not less than 0.01 μm. The vinyl polymer is more effective where silver halide grains have a mean size of not less than 0.1 μm.

The total silver content (including silver halide and an organic silver salt which is one of optional components) in the light-sensitive layer preferably is in the rage of from 0.1 mg/m$^2$ to 10 g/m$^2$. The silver content of the silver halide in the light-sensitive layer preferably is not more than 1 g/m$^2$, more preferably in the range from 1 mg to 90 mg/m$^2$.

The reducing agent employed in the light-sensitive material has a function of reducing the silver halide and/or a function of accelerating or restraining polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4, 5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291–334 (1977), Research Disclosure No. 17029, pp. 9–15 (June 1978), and Research Disclosure No. 17643, pp. 22–31 (December 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p- or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p- or o-methoxyphenyl)hydrazine, 1-(methoxycarbonylbenzohydryl)-2-phenylhydrazine, 1-formyl-2-[4-{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl) -4-methanesulfonyl} phenyl]hydrazine, 1-benzoyl-2-tritylhydrazine, 1-(4-butoxybenzoyl)-2-trityl-hydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C. or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ring-opening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerythritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable componds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

The light-sensitive material can be prepared by arranging a light-sensitive layer containing the above-mentioned components on a support. There is no limitation with respect to the support. In the case that heat development is utilized in the use of the light-sensitive material, material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 $\mu$m is observed in not more than 20 positions among 100 positions which are determined at random on a filtered waviness curve obtained according to JIS-B-0610.

Various embodiments of the light-sensitive materials, optional components which may be contained in the light-sensitive layer, and auxiliary layers which may be optionally arranged on the light-sensitive materials are described below.

The polymerizable compound is preferably dispersed in the form of oil droplets in the light-sensitive layer. Other components in the light-sensitive layer, such as silver halide, the reducing agent and the color image forming substances may be also contained in the oil droplets.

The oil droplets of the polymerizable compound are preferably prepared in the form of microcapsules. There is no specific limitation the microcapsules, and various known types can be employed.

There is also no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The silver halide grains are preferably arranged in the shell material of the microcapsules.

Further, two or more kinds of the microcapsules differing from each other with respect to at least one of the silver halide and the polymerizable compound can be employed. Furthermore, three or more kinds of the microcapsules differing from each other with respect to the color image formation substance is preferably employed to form a full color image.

The mean size of the microcapsule preferably ranges from 3 to 20 $\mu$m. In the light-sensitive material of the invention, the mean grain size of the silver halide grains preferably is not more than the 5th part of the mean size of the microcapsules, more preferably is not more than the 10th part. It is observed that when the mean size of the microcapsules is not less than 5 times as much as the mean grain size of silver halide grains, an even and uniform image can be obtained.

The light-sensitive layer can further contain optional components such as color image forming substances, sensitizing dyes, organic silver salts, various kinds of image formation accelerators, thermal polymerization inhibitors, thermal polymerization initiators, development stopping agents, fluorescent brightening agents, discoloration inhibitors, antihalation dyes or pigments, antiirradiation dyes or pigments, matting agents, antismudging agents, plasticizers, water releasers, binders, photopolymerization initiators and solvents of the polymerizable compound.

The light-sensitive material can obtained a polymer image, and the further obtained a color image containing the color image forming substance as optional components.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substance) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or dispersion.

Examples of the substances which develop to give a color by certain energy include thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heat-sensitive color formation by a chemical change) or in MSS. of the seminer promoted by the Society of Kinki Chemical Industry, "The Newest Chemistry of Coloring Matter-Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

In the case that the color image forming substance comprising two components (e.g., color former and a developer), one component and the polymerizable compound is contained in the microcapsule, and the other component is arranged outside of the microcapsule in the light-sensitive layer, a color image can be formed on the light-sensitive layer.

The color image forming substance in the light-sensitive material is preferably used in an amount of from 0.5 to 20 parts by weight, and more preferably from 2 to 7 parts by weight, per 100 parts by weight of the polymerizable compound. In the case that the developer is used, it is preferably used in an amount of from about 0.3 to about 80 parts by weight per one part by weight of the color former.

There is no specific limitation with respect to the sensitizing dyes, and known sensitizing dyes used in the conventional art of photography may be employed in the light-sensitive material. Examples of the sensitizing dyes include methine dyes, cyanine dyes, merocyanine dyes, complex cyanine dyes, complex merocyanine dyes, holopolar cyanine dyes, hemicyanine dyes, styryl dyes, and hemioxonol dyes. These sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity can be used. The amount of the sensitizing dye to be added generally ranges from about $10^{-8}$ to about $10^{-2}$ mol per 1 mol of silver halide. The sensitizing dye is preferably added during the stage of the preparation of the silver halide emulsion (simultaneously with or after the grain formation).

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mole, and preferably from 0.01 to 1 mole, per 1 mole of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inoragnic bases, organic bases, base precursors, oils, surface active agents, compounds functioning as an antifogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonyl-acetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, the reducing agent and the polymerizable compound are preferably contained in a microcapsule and the base or base precursor is preferably arranged outside of the microcapsule in the light-sensitive layer. Further, the base or base precursor can be contained in a different microcapsule from that containing the polymerizable compound. The base or base precursor can be contained in the microcapsule under condition that the base or base precursor is dissolved or dispersed in an aqueous solution of a water retention agent, or under condition that the base or base precursor is adsorbed on solid particles. Furthermore, the base or base precursor can be contained in a layer different from the light-sensitive layer.

Examples of the oils employable in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as a solvent for the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure pp. 26–28 (December 1976).

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6–18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisiso-butyrate, 2,2'-azobis(2-methylbutyronitrile), and azobis-dimethylvaleronitrile; organic peroxides, e.g., benzoyl peroxide, di-tert-butyl peroxide, dicumyl peroxide, tert-butyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid percursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a mean size of 3 to 50 $\mu$m, more preferably 5 to 40 $\mu$m. The size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978).

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material. The details of the image-receiving layer will be discribed later.

The light-sensitive material of the invention can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980)-158124, and U.S. Pat. No. 3,650,757, etc.

The hydrophilic polymer comprising the gelatin and the protective colloid is preferably used as a protective colloid of silver halide in preparation of the silver halide emulsion. Alternatively, using only gelatin as a protective colloid, the vinyl polymer can be added to the silver halide emulsion simultaneously with or after the preparation.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319 can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When the sensitizing dyes are added to the silver halide emulsion, the sensitizing dye is preferably added during the preparation of the emulsion. When the organic silver salts are introduced into the light-sensitive microcapsule, the emulsion of the organic silver salts can be prepared in the same manner as in the preparation of the silver halide emulsion.

In the preparation of the light-sensitive material, the polymerizable compounds are used as the medium for preparation of the liquid composition containing another component of the light-sensitive layer. For example, the silver halide, (including the silver halide emulsion), the reducing agent, or the color image forming substance can be dissolved, emulsified or dispersed in the polymerizable compound to prepare the light-sensitive material. Especially, the color image forming substance is preferably incorporated into the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, -OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in prepration of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of empolying the above polymer.

Further, optional components, such as the reducing agents, the color image forming substances may dissolved, emulsified or dispersed in the light-sensitive composition. Furthermore, the necessary components for preparation of the microcapsule, such as shell wall-forming materials can be incorporated into in the light-sensitive composition.

The light-sensitive composition are preferably emulsified in an aqueous medium to prepare the microcapsule in the invention. The necessary components for preparation of the microcapsule, such as shell materials can be incorporated into the emulsion. Further, other components such as the reducing agent can be added to the emulsion.

The emulsion of the light-sensitive composition can be processed for forming shell of the microcapsule. Examples of the process for the preparation of the microcapsules include a process utilizing coacervation of hydrophilic wall-forming materials as described in U.S. Pat. Nos. 2,800,457 and 2,800,458; an interfacial polymerization process as described in U.S. Pat. No. 3,287,154, U.K. Pat. No. 990,443 and Japanese Patent Publication Nos. 38(1963)-19574, 42(1967)-446 and 42(1967)-771; a process utilizing precipitation of polymers as described in U.S. Pat. Nos. 3,418,250 and 3,660,304; a process of using isocyanate-polyol wall materials as described in U.S. Pat. No. 3,796,669; a process of using isocyanate wall materials as described in U.S. Pat. No. 3,914,511; a process of using urea-formaldehyde or urea-formaldehyde-resorcinol wall-forming materials as described in U.S. Pat. Nos. 4,001,140, 4,087,376 and 4,089,802; a process of using melamine-formaldehyde resins hydroxypropyl cellulose or like wall-forming materials as described in U.S. Pat. No. 4,025,455; an in situ process utilizing polymerization of monomers as described in U.K. Pat. No. 867,797 and U.S. Pat. No. 4,001,140; an electrolytic dispersion and cooling process as described in U.K. Pat. Nos. 952,807 and 965,074; a spray-drying process as described in U.S. Pat. No. 3,111,407 and U.K. Pat. 930,422; and the like. It is preferable, though not limitative, that the microcapsule is prepared by emulsifying core materials containing the polymerizable compound and forming a polymeric membrane (i.e., shell) over the core materials.

When the emulsion of the polymerizable compound (including the dispersion of the microcapsule) has been prepared by using the light-sensitive composition, the emulsion can be used as the coating solution of the light-sensitive material. The coating solution can be also prepared by mixing the emulsion of the polymerizable compound and the silver halide emulsion.

A light-sensitive material of the invention can be prepared by coating and drying the above-prepared coating solution on a support in the conventional manner.

Use of the light-sensitive material is described below.

In the use of the light-sensitive material of the invention, a development process is conducted simultaneously with or after an imagewise exposure.

Various exposure means can be empoyled in the imagewise exposure, and in general, the latent image on the silver halide is obtained by imagewise exposure to radiation including visible light. The type of light source and exposure can be selected depending on the light-sensitive wavelengths determined by spectral sensitization or sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062 which empolys a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Application No. 60(1985)-135568. Heating temperatures for the development process usually ranges from 80° C. to 200° C., and preferably from 100° C. to 160° C. Various heating patterns are applicable. The heating time is usually from 1 second to 5 minutes, and preferably from 5 seconds to 1 mintue.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized in the same manner as the light-sensitive material described in Japanese Patent Provisional Publication No. 61(1986)-260241.

In the above development process, a polymer image can be formed on the light-sensitive layer. A pigment image can be also obtained by fixing pigments onto the polymer image.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the light-sensitive material. In the case that a porous material, such as paper is employed as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the cases that a polymer image is formed on the image-receiving material and that a dye or pigment is employed as the color image forming substance, the image-receiving material be composed of a simple support.

For example, when a color formation system using a color former and developer is employed, the developer can be contained in the image-receiving layer. Further, the image-receiving layer can be composed of at least one layer containing a mordant. The mordant can be selected from the compounds known in the art of the conventional photography according to the kind of the color image forming substance. If desired, the image-receiving layer can be composed of two or more layers containing two or more mordants different in the mordanting power from each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11} cm^3 \cdot cm/cm^2 \cdot sec \cdot cmHg$ can be used as the binder to protect the color of the image formed on the image-receiving material.

The image-receiving layer can contain a granulated thermoplastic compound to obtain a glossy image. Further, the image-receiving layer can contain a white pigment such as titanium dioxide to function as a white reflection layer. Furthermore, a photo polymerization initiators or a thermal polymerization initiators can be contained in the image-receiving layer to polymerize the unpolymerizable polymerizable compound.

A Dye or pigment can be contained in the image-receiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. There is no specific limitation on the dye and pigment. But in the case that the dye or pigment may disturb the image formed on the image-receiving layer, it is preferred to make the density of the dye or pigment low (e.g. reflection density of not higher than 1), or to employ a dye or pigment having a property of bein discolored when it is heated or irradiated with light.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in the transparent image can be entered in the part of the image-receiving layer containing the white pigment as a reflection image.

After the development process, pressing the light-sensitive material on the image-receiving material to transfer the unpolymerized polymerizable compound to the image-receiving material. a polymer image can be obtained in the image-receiving material. The process for pressing can be carried out in various known manners.

In the case that the light-sensitive layer contains a color image forming substance, the color image forming substance is fixed by polymerization of the polymerizable compound. Then, pressing the light-sensitive material in contact with the image-receiving material to transfer the color image forming substance in unfixed portion, a color image can be produced on the image-receiving material.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

COMPARISON EXAMPLE 1

Preparation of silver halide emulsion

In 1,200 ml of water were dissolved 25 g of gelatin and 3 g of sodium chloride, and the resulting gelatin solution was kept at 70° C. To the gelatine solution, 600 ml of an aqueous solution containing 117 g of potassium bromide and 600 ml of an aqueous solution containing 0.74 mole of silver nitrate were added simultaneously at the same feed rate over a period of 45 minutes. Further, after 5 minutes, to the resulting mixture 200 ml of an aqueous solution containing 2.0 g of potassium iodide and 200 ml of an aqueous solution containing 0.011 mole of silver nitrate were added simultaneously at the same feed rate over 5 minutes.

The emulsion was washed for desalting and then was added 24 g of gelatin, and the mixture was stirred for 15 minutes at 50° C. to obtain a silver halide emulsion (a). The mean size of the silver halide grains was 0.30 μm. The yield of the emulsion was 1,000 g.

Preparation of silver benzotriazole emulsion

In 3,000 ml of water were dissolved 28 g of gelatin and 13.2 g of benzotriazole, and the solution was kept at 40° C. while stirring. To the solution was added 100 ml of a distilled water of 17 g of silver nitrate over 30 seconds. Excessive salts were sedimented by pH-adjustment and removed from the resulting emulsion. Thereafter, the emulsion was adjusted to pH 6.50 to obtain a silver benzotriazole emulsion. The yield of the emulsion was 400 g.

Preparation of light-sensitive composition

In 100 g of trimethylolpropane triacrylate were dissolved 0.1 g of the following copolymer and 10 g of Pargascript Red I-6-B (tradename of Ciba-Geigy) and 2 g of Emulex NP-8 (tradename of Nippon Emulsion Co., Ltd.).

(Copolymer)

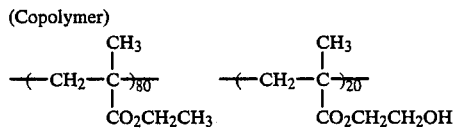

To 18 g of the resulting solution was added a solution in which 0.2 g of the following reducing agent (I) and 0.6 g of the following reducing agent (II) were dissolved in 1.8 g of methylene chloride.

(Reducing agent (I))

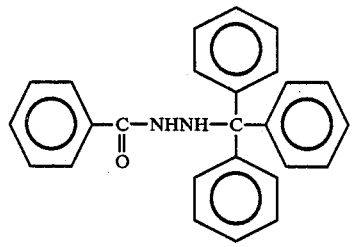

(Reducing agent (II))

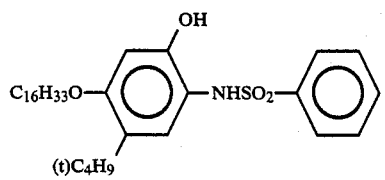

Further, to the resulting solution were added 2 g of the silver halide emulsion (a) and 2 g of the silver benzotriazole emulsion, and the mixture was stirred at 15,000 r.p.m. for 5 minutes to obtain a light-sensitive composition.

Preparation of light-sensitive microcapsule

To the light-sensitive composition was dissolved 10 g of an adduct of xylylene diisocyanate and trimethylolpropan (produced by Takeda Chemical Industries, Ltd.). The resulting solution was added to 70 g of 4% aqueous solution of methyl cellulose, and the mixture was stirred at 7,000 r.p.m. for 2 minutes to obtain an emulsion. The emulsion was subjected to reaction for 2 hours at 40° C. while stirring at 1,000 r.p.m. to obtain a dispersion containing light-sensitive microcapsules which have a shell material made of polyurea resin.

Preparation of light-sensitive material

To 10 g of the light-sensitive microcapsule dispersion were added 1.0 g of 10% aqueous solution of Emulex NP-8 (tradename of Nippon Emulsion Co., Ltd.) and 10 g of 5% aqueous solution of guanidine trichloroacetate to prepare a coating solution. The coating solution was uniformly coated on a cast-coated paper having a basis weight of 85 g using a coating rod to give a layer having a wet thickness of 70 μm and dried at about 30° C. to obtain a light-sensitive material (A).

EXAMPLE 1

Preparation of silver halide emulsion

A silver halide emulsion (b) was prepared in the same manner as in Comparison Example 1, except that 2 g of polyvinyl alchol (PVA-205, produced by Kuraray Co., Ltd.; having a physical retardance of 88.8 according to PAGI method) was added to the aqueous solution of gelatin (1,200 ml of water containing 25 g of gelatin and 3 g of sodium chloride kept at 70° C.) in preparation of silver halide emulsion (a). The mean size of the silver halide grains was 0.27 μm.

Preparation of light-sensitive material

A light-sensitive material (B) was prepared in the same manner as in Example 1, except that 2 g of the silver halide emulsion (b) was used in place of 2 g of the silver halide emulsion (a).

EXAMPLE 2

Preparation of silver halide emulsion

A silver halide emulsion (c) was prepared in the same manner as in Comparison Example1, except that 20 ml of 10% of an aqoueous solution of polyvinyl alcohol (PVA-205, produced by Kuraray Co., Ltd.; having a physical retardance of 88.8 according to PAGI method) was added to a mixture 1 minute after completing addition of an aqueous solution of pottasium bromide and an aqueous solution in preparation of the silver halide emulsion (a). The mean size of the silver halide grains was 0.28 μm.

Preparation of light-sensitive material

A light-sensitive material (c) was prepared in the same manner as in Comparison Example 1, except that 2 g of the silver halide emulsion (c) was used in place of 2 g of the silver halide emulsion (a).

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer.

The coarse dispersion was then finely dispersed in Dynomill dispersing device. To 200 g of the resulting dispersion were added 6 g of 50% latex of SBR (styrene-butadiene rubber) and 55 g of 8% aqueous solution of polyvinyl alcohol, and the resulting mixture was made uniform. The mixture was then uniformly coated on an art paper having a basis weight of 43 g/m² to give a layer having a wet thickness of 30 μm and dried to obtain an image-receiving material.

Evaluation of light-sensitive material

Each of the light-sensitive materials (A) to (C) prepared in Comparison Example 1 and Examples 1 and 2 was imagewise exposed to light through a filter (wedge) in which the density was continuously changed, using a tungsten lamp at 2,000 lux for 1 second and then heated on a hot plate at 125° C. for 10 to 50 seconds. Each of the exposed and heated light-sensitive materials was then comvined with the image-receiving material and passed through press rolls under pressure of 350 kg/cm² to obtain a magenta positive image on the image-receiving material. The density of the obtained image was measured using Macbeth reflection densitometer.

The results are set forth in Table 1. In Table 1, "Latitude in Heating Time" means the range of the heating time to keep a contrast ("maximum density" - "minimum density") of not less than 0.7, "Required Minumum Heating Time" means the minimum time required to obtain an image having the above contrast of not less than 0.7, and "Maximum Density" means the maximum density at the required minimum heating time.

TABLE 1

| Light-Sensitive Material | Silver Halide Emulsion | Latitude in Heating Time | Required Minimum Heating Time | Maximum Density |
|---|---|---|---|---|
| (A) | (a) | 19 seconds | 32 seconds | 1.19 |
| (B) | (b) | 31 seconds | 21 seconds | 1.38 |
| (C) | (c) | 27 seconds | 26 seconds | 1.30 |

It is apparent from the results in Table 1, each of the light-sensitive materials of the invention (B) & (C) gives a clear positive image which has a high maximum density within a short development time. It is also apparent that the light-sensitive material of the invention has a broad latitude in heating time to give the clear image.

COMPARISON EXAMPLE 2

Preparation of silver halide emulsion

A silver halide emulsion (a') was prepared in the same manner as in Comparison Example 1, except that 10 mg of sodium thiosulfate was added to the emulsion after dissolving 24 g of gelatin and the resulting emulsion was subjected to a chemical sensitization at 60° C. for 30 minutes.

Preparation of light-sensitive material

A light-sensitive material (D) was prepared in the same manner as in Comparison Example 1, except that 2 g of the silver halide emulsion (a') was used in place of 2 g of the silver halide emulsion (a).

EXAMPLE 3

Preparation of silver halide emulsion

A silver halide emulsion (b') was prepared in the same manner as in Example 1, except that 10 mg of sodium thiosulfate was added to the emulsion after dissolving 24 g of gelatin and the resulting emulsion was subjected to a chemical sensitization at 60° C. for 30 minutes.

Preparation of light-sensitive material

A light-sensitive material (E) was prepared in the same manner as in Comparison Example 1, except that 2 g of silver halide emulsion (b') was used in place of 2 g of silver halide emulsion (a).

EXAMPLE 4

Preparation of silver halide emulsion

A silver halide emulsion (c') was prepared in the same manner as in Comparison Example 2, except that 10 mg of sodium thiosulfate was added to the emulsion after dissolving 24 g of gelatin and the resulting emulsion was subjected to a chemical sensitization at 60° C. for 30 minutes.

Preparation of light-sensitive material

A light-sensitive material (F) was prepared in the same manner as in Comparison Example 1, except that 2 mg of the silver halide emulsion (c') was used in place of 2 mg of the silver halide emulsion (a).

Evaluation of light-sensitive material

Each of the light-sensitive material (D) to (F) prepared in Comparison Example 2 and Examples 3 and 4 was evaluated in the same manner as in Comparison Example 1 and Examples 1 and 2, and the density of the obtained magenta positive image was measured using Macbeth reflection densitometer.

The results are set forth in Table 2. In Table 2, "Latitude in Heating Time", "Required Minimum Heating Time" and "Maximum Density" have the same meanings in Table 1.

TABLE 2

| Light-Sensitive Material | Silver Halide Emulsion | Latitude in Heating Time | Required Minimum Heating Time | Maximum Density |
|---|---|---|---|---|
| (D) | (a') | 10 seconds | 20 seconds | 0.93 |
| (E) | (b') | 25 seconds | 18 seconds | 1.25 |
| (F) | (c') | 24 seconds | 18 seconds | 1.11 |

It is apparent from the results in Table 2 that in a system employing the chemical sensitized silver halide emulsion, each of the light-sensitive materials of the invention gives a clear positive image which has a high maximum density within a short development time. It is also apparent that each of the light-sensitive materials of the invention has a broad latitude in heating time to give the clear image.

COMPARISON EXAMPLE 3

Preparation of light-sensitive material

A light-sensitive material (G) was prepared in the same manner as in Comparison Example 1, except that the silver benzotriazole emulsion was not added.

EXAMPLE 5

Preparation of light-sensitive material

A light-sensitive material (H) was prepared in the same manner as in Example 1, except that the silver benzotriazole emuslion was not added.

EXAMPLE 6

Preparation of light-sensitive material

A light-sensitive material (I) was prepared in the same manner as in Example 2, except that the silver benzotriazole emulsion was not added.

Evaluation of light-sensitive material

Each of the light-sensitive material (G) to (I) prepared in Comparison Example 3 and Examples 5 and 6 was evaluated in the same manner as in Comparison Example 1 and Examples 1 and 2, and the density of the obtained magenta positive image was measured using Macbeth reflection densitometer.

The results are set forth in Table 3. In Table 3, "Latitude in Heating Time", "Required Minimum Heating Time" and "Maximum Density" have the same meanings in Table 1.

TABLE 3

| Light-Sensitive Material | Silver Halide Emulsion | Latitude in Heating Time | Required Minimum Heating Time | Maximum Density |
|---|---|---|---|---|
| (G) | (a) | 25 seconds | 35 seconds | 1.07 |
| (H) | (b) | 35 seconds | 24 seconds | 1.30 |
| (I) | (c) | 33 seconds | 28 seconds | 1.28 |

It is apparent from the results in Table 3 that in a system employing no organic silver salt (silver benzotriazole), each of the light-sensitive materials of the invention gives a clear positive image within a short development time. It is also apparent that each of the light-sensitive materials of the invention has a broad latitude in heating time to give the clear image.

I claim:

1. A light-sensitive material comprising a light-sensitive layer containing silver halide, a hydrophilic polymer, a reducing agent and an ethylenically unsaturated polymerizable compound provided on a support, said hydrophilic polymer being adsorbed on the silver halide, wherein the hydrophilic polymer comprises gelatin and a water soluble vinyl polymer in a ratio of the vinyl polymer to the gelatin ranging from 0.1 to 20 weight %, said vinyl polymer having a high physical retardance of not less than 25.0 which is a value measured according to PAGI method.

2. The light-sensitive material as claimed in claim 1, wherein the vinyl polymer has a physical retardance of 55.0 to 95.0.

3. The light-sensitive material as claimed in claim 1, wherein the ratio of the vinyl polymer to the gelatin ranges from 0.5 to 5 weight %.

4. The light-sensitive material as claimed in claim 1, wherein the light-sensitive layer contains the vinyl polymer in an amount of 0.1 to 25 weight % based on the silver content of the silver halide.

5. The light-sensitive material as claimed in claim 1, wherein the vinyl polymer has hydroxyl group or amide bond.

6. The light-sensitive material as claimed in claim 1, wherein the vinyl polymer is selected from the group consisting of polyvinyl alcohol, a polyvinyl alcohol derivative, polyvinyl pyrrolidone, a polyvinyl pyrrolidone dervative, polyvinyl imidazole, a polyvinyl imidazole derivative and a copolymer comprising at least two kinds of the repeating units contained in these polymers.

7. The light-sensitive material as claimed in claim 1, wherein the silver halide is in the form of grains having a mean size of 0.01 to 5 $\mu$m.

8. The light-sensitive material as claimed in claim 1, wherein the light-sensitive layer contains a color image forming substance.

9. A light-sensitive material comprising a light-sensitive layer containing silver halide, a reducing agent and an ethylenically unsaturated polymerizable compound provided on a support, said silver halide having a hydrophilic polymer adsorbed thereon, wherein the silver halide and polymerizable compound are contained in microcapsules which are dispersed in the light-sensitive layer, and the hydrophilic polymer comprises gelatin and a water soluble vinyl polmer in a ratio of the vinyl polymer to the gelatin ranging from 0.1 to 20 weight %, said vinyl polymer having a high physical retardance of not less than 25.0 which is a value measured according to PAGI method.

10. The light-sensitive material as claimed in claim 9, wherein the vinyl polymer has a physical retardance of 55.0 to 95.0.

11. The light-sensitive material as claimed in claim 9, wherein the ratio of vinyl polmer to the gelatin ranges from 0.5 to 5 weight %.

12. The light-sensitive material as claimed in claim 9, wherein the light-sensitive layer contains the vinyl polymer in an amount of 0.1 to 25 weight % based on the silver content of the silver halide.

13. The light-sensitive material as claimed in claim 9, wherein the vinyl polymer contains a hydroxyl group or amide bond.

14. The light-sensitive material as claimed in claim 9, wherein the vinyl polymer is selected from the group consisting of polyvinyl alcohol, a polyvinyl alcohol derivative, polyvinyl pyrrolidone, a polyvinyl pyrrolidone derivative, polyvinyl imidazole, a polyvinyl imidazole derivative and a copolymer comprising at least two kinds of repeating units contained in these polymers.

15. The light-sensitive material as claimed in claim 9, wherein the silver halide is in the form of grains having a mean size of 0.01 to 5 $\mu$m.

16. The light-sensitive material as claimed in claim 9, wherein the light-sensitive layer contains a color image forming substance, said color image forming substance being contained in the microcapsules.

17. The light-sensitive material as claimed in claim 9, wherein the reducing agent is contained in the microcapsules.

* * * * *